United States Patent
Rim

(10) Patent No.: US 8,416,637 B2
(45) Date of Patent: Apr. 9, 2013

(54) SEMICONDUCTOR MEMORY APPARATUS, AND CIRCUIT AND METHOD FOR CONTROLLING FAULTY ADDRESS THEREIN

(75) Inventor: Woo Jin Rim, Ichon (KR)

(73) Assignee: SK Hynix Inc., Gyeonggi-do (KR)

(*) Notice: Subject to any disclaimer, the term of this patent is extended or adjusted under 35 U.S.C. 154(b) by 384 days.

(21) Appl. No.: 12/836,505

(22) Filed: Jul. 14, 2010

(65) Prior Publication Data

US 2011/0157969 A1  Jun. 30, 2011

(30) Foreign Application Priority Data

Dec. 24, 2009  (KR) .................. 10-2009-0130710

(51) Int. Cl.
  *G11C 17/18*  (2006.01)
(52) U.S. Cl.
  USPC ........ 365/225.7; 365/148; 365/158; 365/163; 365/200
(58) Field of Classification Search .................. 365/148, 365/158, 163, 171, 173, 225.5, 225.6, 225.7, 365/200
  See application file for complete search history.

(56) References Cited

U.S. PATENT DOCUMENTS

| | | |
|---|---|---|
| 6,324,669 B1 | 11/2001 | Westby |
| 6,594,244 B1 | 7/2003 | Chang et al. |
| 6,633,999 B1 | 10/2003 | Lee |
| 7,174,498 B2 | 2/2007 | Weissinger |
| 2003/0099130 A1* | 5/2003 | Hidaka .................. 365/158 |
| 2003/0214861 A1* | 11/2003 | Takano et al. ............ 365/200 |
| 2008/0315388 A1 | 12/2008 | Periaman et al. |
| 2009/0020865 A1 | 1/2009 | Su |
| 2009/0134500 A1 | 5/2009 | Kuo |
| 2009/0166873 A1 | 7/2009 | Yang et al. |

FOREIGN PATENT DOCUMENTS

| | | |
|---|---|---|
| JP | 2005-006298 | 1/2005 |
| KR | 1020070093747 A | 9/2007 |
| KR | 100809325 | 2/2008 |
| KR | 10200800988993 A | 11/2008 |
| KR | 1020090098287 A | 9/2009 |

* cited by examiner

*Primary Examiner* — Richard Elms
*Assistant Examiner* — Hien Nguyen
(74) *Attorney, Agent, or Firm* — William Park & Associates Ltd.

(57) ABSTRACT

A faulty address control circuit comprises a variable resistance fuse unit configured to be driven in response to an address signal, a resistance value of the variable resistance fuse unit being determined based on an amount of an applied current; a driving unit configured to output a driving signal based on the resistance value of the variable resistance fuse unit in response to a faulty address control signal; and an address storage and determination unit configured to receive the address signal, be driven by the driving signal to output the address signal or an inverted signal of the address signal.

10 Claims, 4 Drawing Sheets

US 8,416,637 B2

SEMICONDUCTOR MEMORY APPARATUS, AND CIRCUIT AND METHOD FOR CONTROLLING FAULTY ADDRESS THEREIN

CROSS-REFERENCE TO RELATED APPLICATION

The present application claims priority under 35 U.S.C. §119(a) to Korean Application No. 10-2009-0130710, filed on Dec. 24, 2009, in the Korean Intellectual Property Office, which is incorporated herein by reference in its entirety as if set forth in full.

BACKGROUND

1. Technical Field

Various aspects of the present disclosure generally relate to a semiconductor apparatus, and more particularly, to a semiconductor memory apparatus that comprises a circuit and a method for controlling a faulty address in the semiconductor memory apparatus.

2. Related Art

A semiconductor memory apparatus comprises memory cells which may fail to perform normal operations due to problems occurred in the manufacturing process and its operations. Since the size of a unit memory cell diminishes as the degree of integration in a memory apparatus increases, the number of memory cells which do not perform normal operations increases accordingly.

Based on the above, redundancy memory cells capable of replacing faulty memory cells are integrated to improve productivity. When an externally inputted address designates a faulty memory cell, a repair process is conducted such that the address of a redundancy memory cell replaces a logic address that accesses the corresponding faulty memory cell. Therefore, a semiconductor memory apparatus needs a circuit for storing the physical address of the faulty memory cell and a circuit that determines if an externally inputted address designates the faulty memory cell.

A method has been adopted to store the faulty address when a metal fuse corresponding to the faulty address is blown using a laser beam, which results in an open circuit.

FIG. 1 illustrates the faulty address storing method in accordance with a conventional art.

According to the art, a faulty address is recorded by cutting off relevant metal fuses to conduct a repair process. Specifically, as shown in FIG. 1, each of the metal fuses corresponding to the faulty address is heated by a laser beam. The heated fuses are then thermally expanded due to increase in the internal pressure, and blown, resulting in an open circuit.

FIGS. 2A and 2B show two diagrams that illustrate the operation of a conventional faulty address storage circuit.

FIG. 2A illustrates a faulty address storage circuit when the metal fuse F is not cut.

When the faulty address control signal EN is enabled, a node K1 is at a high level, and an output signal OUT is at the opposite phase of the input address ADD.

On the other hand, FIG. 2b illustrates a faulty address storage circuit where the fuse metal F is cut. In FIG. 2b, the node K1 is at a low level, and the output signal OUT has a phase that is the same as the input address ADD.

When a semiconductor memory apparatus uses an N-bit address system, values corresponding to the respective bits of the faulty address are stored in N-faulty address storage circuits, respectively. Each of them has the structure shown in FIGS. 2A and 2B. In other words, the metal fuses from the faulty address storage circuits corresponding to the high level bit values of an N-bit faulty address are cut. The respective bits of an externally inputted N-bit address are sequentially applied to the N-faulty address storage circuits to determine whether the externally inputted N-bit address matches the faulty address.

If some of the metal fuses are cut, the address storage circuits generate signals having the same level as the corresponding inputted address bits. If the metal fuses are not cut, signals with a level opposite to the inputted address are outputted. Then, a logical AND operation is performed on the output signals of the respective faulty address storage circuits. If a resultant output signal is high, it is decided that the corresponding redundancy cell should be accessed.

For example, if a faulty address is 0110, the metal fuses of faulty address storage circuits corresponding to the high bit values, or the second and third faulty address storage circuits, are cut.

Furthermore, if an externally inputted address is 0110 which is identical to the faulty address, all the respective output signals of four faulty address storage circuits become high. Therefore, since the resultant output signal obtained by performing an AND operation on the respective output signals is high, it is decided that an access to the redundancy cell is necessary.

Meanwhile, if the faulty address is 0110 and an externally inputted address is 0100, the four faulty address storage circuits output 1101 bits. Since the externally inputted address does not match the faulty address in this case, an access may be made to a memory cell which has a corresponding address of 0100.

However, since the repair scheme using metal fuses is based on the assumption that the laser beam never fails to reach the desired metal fuse, the metal fuse should be physically large enough to meet the assumption. This is one of the reasons to adversely affect the degree of integrity of semiconductor memory devices.

Furthermore, there is also a problem of increased cost due to expensive manufacturing equipments that should be used to store faulty addresses in the semiconductor memory devices, such as a laser irradiation device.

SUMMARY

In one aspect of the present invention, a faulty address control circuit comprises a variable resistance fuse unit configured to be driven in response to an address signal, a resistance value of the variable resistance fuse unit being determined based on an amount of an applied current to the variable resistance fuse unit; a driving unit configured to output a driving signal based on the resistance value of the variable resistance fuse unit in response to a faulty address control signal; and an address storage and determination unit configured to receive the address signal, and be driven by the driving signal to output the address signal or an inverted signal of the address signal.

In another aspect of the present invention, a semiconductor memory apparatus comprises a main cell array; a redundancy cell array; an address buffer configured to convert an external address signal into an internal address signal to output the internal address signal; a faulty address control circuit configured to store an address of a faulty memory cell in the main cell array by changing a resistance value based on an amount of an applied current, compare the internal address signal with the address of the faulty memory cell as the internal address signal is inputted to output a decoding enable signal; a main decoder configured to be driven in response to the decoding enable signal to generate a signal to access a memory cell in the main cell array; a redundancy decoder configured to be driven in response to the decoding enable signal to generate a signal to access a memory cell in the redundancy cell array.

In another aspect of the present invention, a faulty address control method using one or more variable resistance elements which are determined in resistance values based on an amount of an applied current is provided. The method comprises the steps of: inputting a faulty address signal; and applying a programming current to a variable resistance element selected by the faulty address signal and determining a resistance value of the variable resistance element.

In another aspect of the present invention, a faulty address control method using one or more variable resistance elements, resistance values of the one or more variable resistance elements being determined based on an amount of an applied current is provided. The method comprising the steps of: inputting an uppermost fault bit of a faulty address signal to a high level; applying a programming current to a variable resistance element selected by the fault bit and determining a resistance value of the variable resistance element; repeating the above-described process for each fault bit of the faulty address signal and storing a faulty address.

BRIEF DESCRIPTION OF THE DRAWINGS

The accompanying drawings, which are incorporated in and constitute a part of this specification, illustrate various embodiments consistent with the invention and, together with the description, serve to explain the principles of the invention.

DETAILED DESCRIPTION

Figure 1:
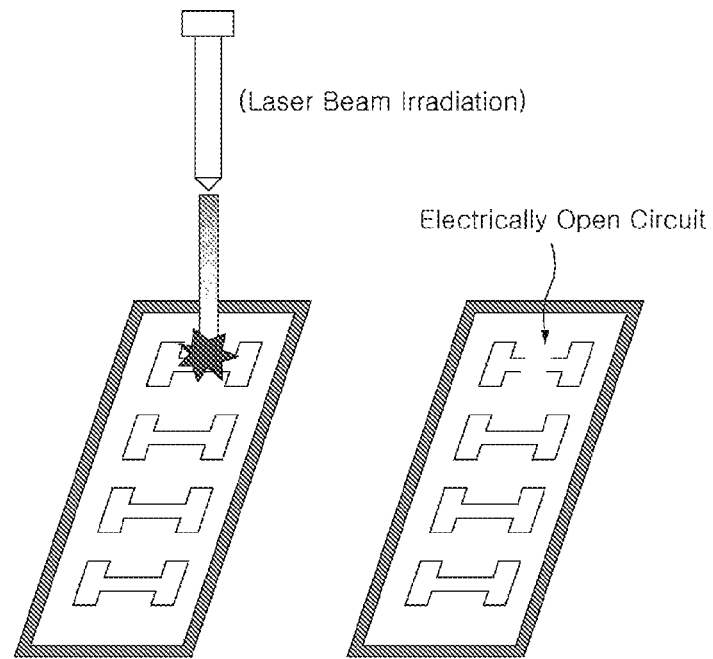
FIG. 1 illustrates a faulty address storing principle according to the conventional art.
Figure 2A:
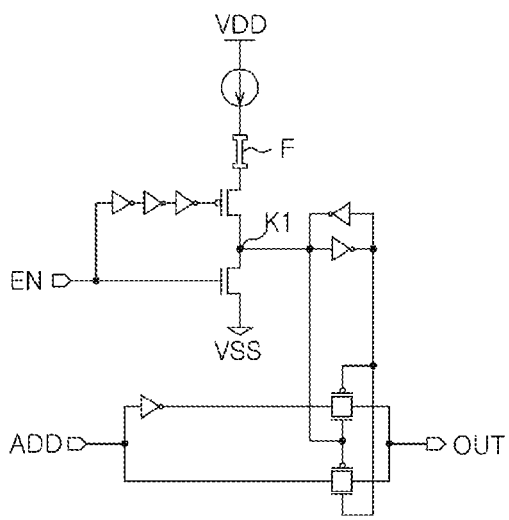
FIG. 2 shows two diagrams illustrating a conventional faulty address storage circuit.
Figure 2B:
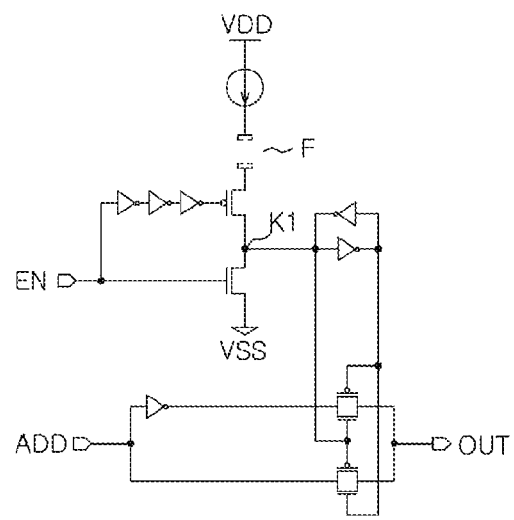

Advantages and characteristics of the present invention and a method for achieving them will be apparent with reference to embodiments described below in addition with reference to the accompanying drawings. However, the present invention is not limited to the exemplary embodiments described below but may be implemented in various forms. Therefore, the exemplary embodiments are provided to enable those skilled in the art to thoroughly understand the teaching of the present invention and to completely inform the scope of the present invention and the exemplary embodiment is just defined by the scope of the appended claims. Throughout the specification, like elements refer to like reference numerals.

Figure 3:
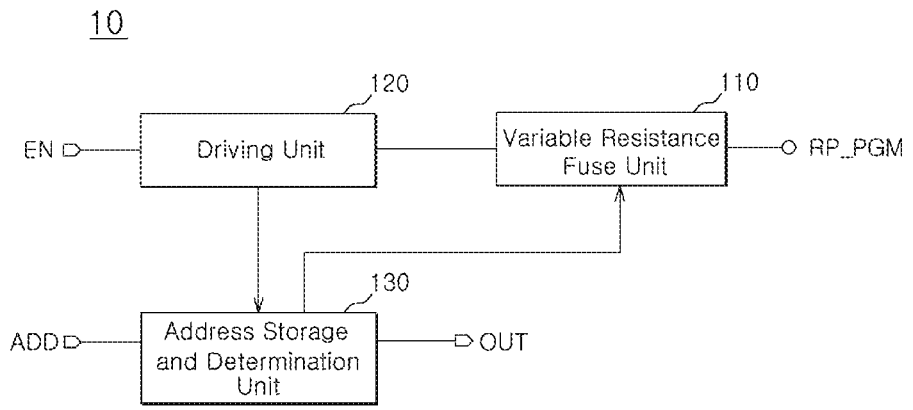
FIG. 3 is a block diagram illustrating a faulty address control circuit according to an exemplary embodiment.

FIG. 3 is a block diagram illustrating a faulty address control circuit according to an exemplary embodiment.

Referring to FIG. 3, a faulty address control circuit 10 comprises a variable resistance fuse unit 110, a driving unit 120, and an address storage and determination unit 130.

First, a resistance value of the variable resistance fuse unit 110 is determined, based on the amount of current applied through a repair program terminal RP_PGM in response to the address signal outputted from the address storage and determination unit 130.

The driving unit 120 is configured to determine whether to drive the address storage and determination unit 130, depending on the resistance value of the variable resistance fuse unit 110 in response to a faulty address control signal EN.

The address storage and determination unit 130 is configured to receive an address signal ADD, and, depending on the output signal of the driving unit 120, is driven to output the address signal ADD or the inverted signal thereof as an output signal OUT.

More specifically, the variable resistance fuse unit 110 comprises a variable resistor which is programmed by the current applied through the repair program terminal RP_PGM. The variable resistor may be programmed to a high resistance state when an address signal inputted from the address storage and determination unit 130 indicates a normal address. The variable resistor may also be programmed to a low resistance state when a faulty address signal is inputted. It is important to note that there are other ways to control the programmed state of the variable resistor. The low resistance state and the high resistance state may be determined in a variety of ways.

The variable resistor may be composed of a phase change material. A typical example of the phase change material is germanium/stibium/tellurium ($Ge_2Sb_2Te_5$: GST), a type of Chalcogenide compound. The GST is a material that changes its crystal structure when an appropriate current is applied. It has a nonvolatile characteristic—the state of the crystal material is maintained even when the applied voltage/current is removed. In general, the GST exhibits low resistance in a crystalline state and high resistance in an amorphous state. Therefore, it is possible to store a faulty address of a semiconductor memory apparatus by controlling the phase change material to the low resistance state or the high resistance state.

Figure 4:
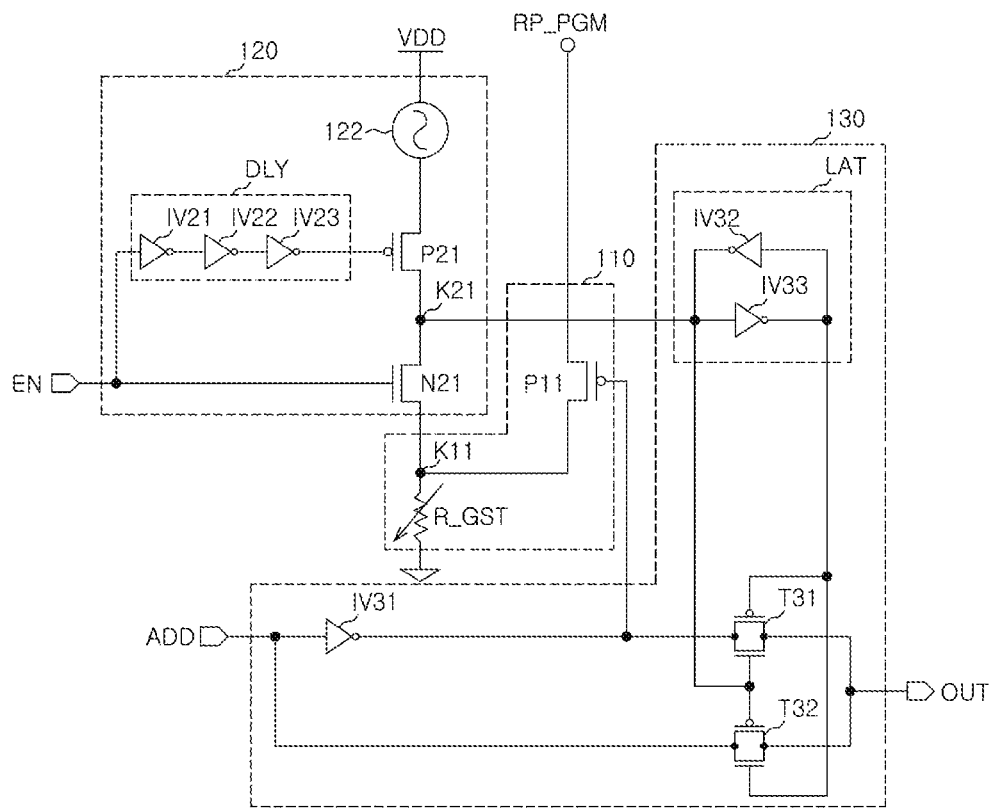
FIG. 4 is a diagram illustrating the configuration of the faulty address control circuit shown in FIG. 3.

FIG. 4 is a diagram illustrating the configuration of the faulty address control circuit shown in FIG. 3.

Referring to FIG. 4, the variable resistance fuse unit 110 comprises a first switching element P11 and a variable resistance element R_GST. The first switching element P11 is connected between the repair program terminal RP_PGM and a first node K11, and is driven by the address signal ADD. The variable resistance element R_GST is connected between the first node K11 and a ground voltage terminal VSS. The resistance value of the variable resistance element R_GST changes based on the amount of current applied through the first switching element P11.

The variable resistance element R_GST may be implemented using a phase change material, for example, a GST.

The driving unit 120 comprises an inverting delay section DLY which inverts and delays the faulty address control signal EN, a current source 122 connected to a power supply voltage terminal VDD, a second switching element P21 that is connected between the current source 122 and a second node K21 and is driven by the output signal of the inverting delay section DLY, and a third switching element N21 that is connected between the second node K21 and the first node K11 and is driven by the faulty address control signal EN.

The address storage and determination unit 130 comprises a latch section LAT which latches the output signal outputted from the second node K21, a first transmission gate T31 driven by the output signal of the latch section LAT and that outputs the inverted signal of the address signal ADD as the output signal OUT, and a second transmission gate T32 driven by the output signal of the latch section LAT and that outputs the non-inverted signal of the address signal ADD as the output signal OUT.

The reference symbols IV21, IV22, IV23, IV31, IV32 and IV33 denote inverters.

The variable resistance element R_GST has a high resistance when it is in the amorphous state. If the variable resistance element R_GST is in the amorphous state, since the potential difference $V_{GS}$ between the gate and the source of the third switching element N21 is less than the threshold voltage of the third switching element N21, the third switching element N21 is turned off when a high level of the faulty address control signal EN is enabled. As a result, a signal with a high level is outputted from the second node K21.

On the other hand, the variable resistance element R_GST has a low resistance when it is in the crystalline state. If the variable resistance element R_GST is in the crystalline state, since the potential difference $V_{GS}$ between the gate and the source of the third switching element N21 is greater than the threshold voltage of the third switching element N21, the third switching element N21 is turned on when a high level of the faulty address control signal EN is enabled. As a result, second node K21 outputs a signal with a low level.

Consequently, when the variable resistance element R_GST is in the high resistance state, the first transmission gate T31 is turned on and the inverted signal of the address signal ADD is outputted as the output signal OUT. Moreover, when the variable resistance element R_GST is in the low resistance state, the second transmission gate T32 is turned on, and the non-inverted signal of the address signal ADD is outputted as the output signal OUT.

Comparing the inventive faulty address control circuit with the faulty address storage circuit using metal fuses, if metal fuses are not cut, the inverted signal of the address signal is outputted and the variable resistance element R_GST may be controlled to the high resistance state, allowing the normal address to be stored. When the metal fuses are cut, the faulty address storage circuit outputs the non-inverted signal of the address signal and the variable resistance element R_GST may be controlled to the low resistance state, allowing a faulty address to be stored.

Hereinafter, the operations of the faulty address control circuit 10 configured as mentioned above will be described with reference to FIG. 5.

Storage of a Faulty Address

Figure 5:
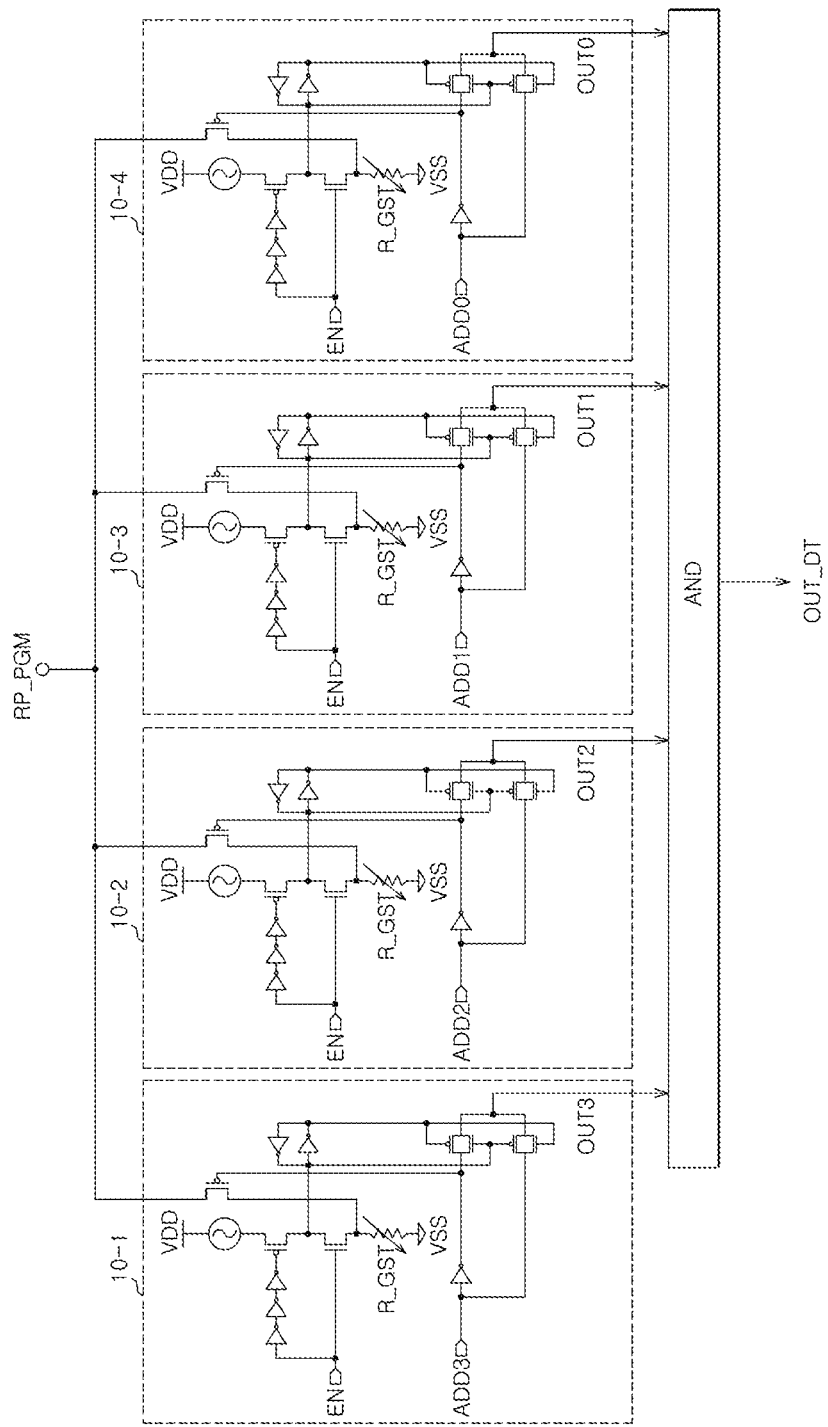
FIG. 5 is a diagram explaining a method for controlling a faulty address according to an exemplary embodiment.

First, storing a faulty address in the variable resistance fuse unit 110 will be explained with reference to a 4-bit address system. In this case, the fault bits among the faulty address ADD[3:0] to be stored are sequentially applied at a high level to first through fourth faulty address control circuits 10-1, 10-2, 10-3 and 10-4, respectively. These are shown in FIG. 5.

A current that is enough to change the variable resistance element R_GST to, for example, the low resistance state, is supplied to the repair program terminal RP_PGM, and the faulty address control signal EN is disabled. This isolates the variable resistance fuse unit 110.

Accordingly a fault bit, or a high level address signal, inputted to the first switching element P11, turns on the first switching element P11. When the current supplied to the repair program terminal RP_PGM is introduced to the variable resistance element R_GST, the variable resistance element R_GST has a low resistance value. A phase change material may constitute the variable resistance element R_GST, in which the phase change material changes to a crystalline state. However, when an address signal is not inputted as the fault bit to the faulty address control circuit but inputted at a low level, the first switching element P11 is turned off, a current is not introduced from the repair program terminal RP_PGM, and the variable resistance element R_GST is maintained at a high resistance state.

After storing the first fault bit is completed, only address signals corresponding to the subsequent high level fault bits are stored by repeating the process described above.

Such a process is repeated by the number of fault bits. Consequently, a faulty address is stored in the faulty address control circuits.

For example, if a faulty address is 0110, the first fault bit is stored by applying an address signal of 0100. For example, low address signals are applied to the first, third and fourth faulty address control circuits 10-1, 10-3 and 10-4, respectively. A high address signal is applied to the second faulty address control circuit 10-2. Therefore, only the first switching element P11 of the second faulty address control circuit 10-2 is turned on, and the variable resistance element R_GST of the second faulty address control circuit 10-2 changes to a low resistance state.

An address signal of 0010 is then applied in order to store a second fault bit ADD[1]. For example, a low level of address signals are applied to the first, second and fourth faulty address control circuits 10-1, 10-2 and 10-4, respectively. A high address signal is applied to the third faulty address control circuit 10-3. This causes the variable resistance element R_GST of the third faulty address control circuit 10-3 to change to a low resistance state.

Consequently, the variable resistance elements R_GST of the second and third faulty address control circuits 10-2 and 10-3 are maintained at the low resistance state, and the first and fourth faulty address control circuits 10-1 and 10-4 are maintained at the high resistance state.

Determination of a Faulty Address

If an address signal for selecting a certain memory cell of the semiconductor memory apparatus is inputted after the faulty address is stored by the method mentioned above, it is necessary to determine whether the corresponding memory cell should be repaired.

As the address ADD[3:0] of the preselected memory cell is inputted, the bits of the address ADD[3:0] are respectively inputted into the first through fourth faulty address control circuits 10-1, 10-2, 10-3 and 10-4.

In a normal mode, the repair program terminal RP_PGM is in a floating state. When the faulty address control signal EN is enabled, each of the faulty address control circuits 10-1, 10-2, 10-3 and 10-4 outputs the address signal or the inverted signal thereof based on the designation of the inputted address signal.

For example, when the variable resistance element R_GST is in the high resistance state, the output signal OUT that has a phase opposite to the phase of the inputted address bit is outputted. When the variable resistance element R_GST is in the low resistance state, the output signal OUT, which has a phase the same as the phase of the inputted address bit, is outputted.

The output signals OUT[3:0] of the respective faulty address control circuits 10-1, 10-2, 10-3 and 10-4 are inputted to an AND element AND. Based on the level of a faulty address determination signal OUT_DT outputted by the AND element AND, it may be possible to determine whether the inputted address matches the fault address.

For example, in the state in which a faulty address 0110 is stored, if 0110 is inputted as an address for selecting a memory cell, in the first and fourth faulty address control circuits 10-1 and 10-4 in which the variable resistance elements R_GST are in the high resistance state, and the output signals which have a phase opposite to the phase of the inputted address bits, or high level signals, are outputted (OUT[3]=H, OUT[0]=H).

Also, the second and third faulty address control circuits 10-2 and 10-3 where the variable resistance elements R_GST are in a low resistance state output signals with the same phase of the inputted address bits. More specifically, high level signals are outputted (OUT[2]=H, OUT[1]=H).

The high level output signals OUT[3:0]=H outputted from the respective faulty address control circuits 10-1, 10-2, 10-3 and 10-4 are logically ANDed by the AND element AND, and as a result, the high level faulty address determination signal OUT_DT is outputted. For example, since the inputted address corresponds to the previously stored faulty address, a decision is made to the effect that it is necessary to access a redundancy cell.

If faulty address 1100 is inputted as an address for selecting a memory cell in the state in which it is stored into the first and fourth faulty address control circuits 10-1 and 10-4 in which the variable resistance elements R_GST are in the high resistance state, the output signal with the opposite phase of the inputted address bit, that is, a low level signal is outputted from the first faulty address control circuit 10-1 (OUT[3]=L), and a high level signal is outputted from the fourth faulty address control circuit 10-4 (OUT[0]=H).

A high level signal is then outputted from the second faulty address control circuit 10-2 (OUT[2]=H), and a low level signal is outputted from the third faulty address control circuit 10-3 (OUT[1]=L). In these control circuits, the variable resistance elements R_GST are in the low resistance state, and the output has the same phase that the inputted address bit has. As a result, the output signals OUT[3:0] of the respective faulty address control circuits become 0101. The output signals are logically ANDed by the AND element AND, and the low faulty address determination signal OUT_DT is outputted. In other words, it is possible to access the corresponding memory cell since the inputted address is not identical to the previously stored faulty address.

Figure 6:
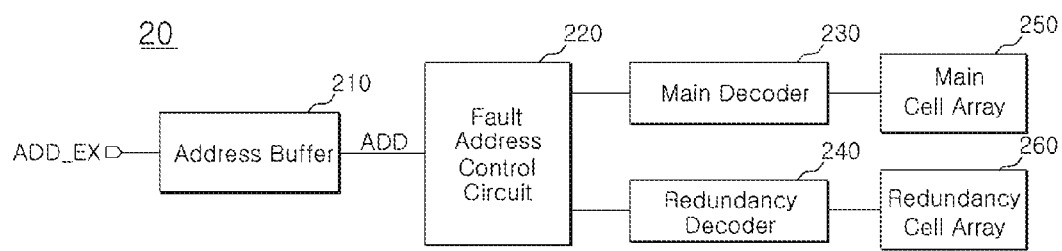
FIG. 6 is a block diagram illustrating the configuration of a semiconductor memory apparatus according to an exemplary embodiment.

FIG. 6 is a block diagram illustrating the configuration of a semiconductor memory apparatus according to another aspect of the present invention.

Referring to FIG. 6, a semiconductor memory apparatus 20 according to another aspect of the present invention comprises an address buffer 210, a faulty address control circuit 220, a main decoder 230, a redundancy decoder 240, a main cell array 250, and a redundancy cell array 260.

The address buffer 210 receives an external address ADD_EX and converts the external address ADD_EX into an internal address ADD.

The faulty address control circuit 220 stores the address of a faulty memory cell located near the memory cells in the main cell array 250 and outputs a decoding enable signal by determining whether the inputted internal address ADD designates the faulty memory cell or a normal memory cell.

The faulty address control circuit 220 outputs the decoding enable signal, which in turn drives the main decoder 230. The main decoder then generates a signal for accessing the corresponding memory cell when the internal address ADD designates the normal memory cell. The decoding enable signal also drives the redundancy decoder 230. The redundancy decoder 230 generates a signal for accessing a redundancy cell when the internal address ADD designates the faulty memory cell.

The faulty address control circuit 220 may adopt the faulty address control circuit as shown in FIGS. 3 and 4. One or more faulty address control circuits 10 may be used, based on the address system.

While certain aspects have been described above, it will be understood to those skilled in the art that the embodiments described are by way of examples only. Accordingly, the semiconductor memory apparatus, and the circuit and the method for controlling a faulty address in the semiconductor memory apparatus described herein should not be limited to the described embodiments. Rather, the semiconductor memory apparatus, and the circuit and the method for controlling a faulty address in the semiconductor memory apparatus described herein should only be limited in light of the claims that follow when taken in conjunction with the above description and accompanying drawings.

What is claimed is:

1. A faulty address control circuit comprising:
   a variable resistance fuse unit configured to be driven in response to an address signal, a resistance value of the variable resistance fuse unit being determined based on an amount of an applied current to the variable resistance fuse unit;
   a driving unit configured to output a driving signal based on the resistance value of the variable resistance fuse unit in response to a faulty address control signal; and
   an address storage and determination unit configured to receive the address signal, and be driven by the driving signal to output the address signal or an inverted signal of the address signal.

2. The faulty address control circuit according to claim 1, wherein the variable resistance fuse unit comprises a variable resistance element in which a state of crystals is changed based on the amount of applied current.

3. The faulty address control circuit according to claim 1, wherein the variable resistance fuse unit comprises:
   a first switching element connected between a current supply terminal and a first node and driven in response to the address signal; and
   a variable resistance element connected between the first node and a ground voltage terminal, wherein a resistance value of the variable resistance element represents the resistance value of the variable resistance fuse unit, and the resistance value of the variable resistance element is determined based on an amount of a current applied through the first switching element.

4. The faulty address control circuit according to claim 3, wherein the variable resistance element comprises an element whose state of crystals is changed based on the amount of the applied current.

5. The faulty address control circuit according to claim 4, wherein the variable resistance element comprises a phase change material.

6. The faulty address control circuit according to claim 4, wherein the variable resistance element comprises a germanium/ stibium/tellurium(Ge2Sb2Te5: GST) compound.

7. The faulty address control circuit according to claim 3, wherein the driving unit comprises:
   a current source connected to a power supply voltage terminal;
   a second switching element connected between the current source and a second node and driven in response to the faulty address control signal; and
   a third switching element connected between the second node and the first node and driven in response to the faulty address control signal.

8. The faulty address control circuit according to claim 7, wherein the address storage and determination unit comprises:
   a latch section configured to latch an output signal of the second node;

a first transmission gate configured to be driven in response to an output signal of the latch section to output the inverted signal of the address signal; and a second transmission gate configured to be driven in response to the output signal of the latch section to output a non-inverted signal of the address signal.

9. The faulty address control circuit according to claim 8, wherein the address storage and determination unit outputs the inverted signal of the address signal through the first transmission gate when the variable resistance element is in a high resistance state.

10. The faulty address control circuit according to claim 8, wherein the address storage and determination unit outputs the non-inverted signal of the address signal through the second transmission gate when the variable resistance element is in a low resistance state.

* * * * *